United States Patent [19]
Crane

[11] Patent Number: 5,995,549
[45] Date of Patent: Nov. 30, 1999

[54] NETWORK SYSTEM USING LOW-SPEED PREAMBLE FOR LINKING USER NODES USING HIGH SPEED CSMA/CD COMMUNICATION

[76] Inventor: Ronald C. Crane, 2101 California St., Apt. 329, Mountain View, Calif. 94040

[21] Appl. No.: 09/114,727

[22] Filed: Jul. 14, 1998

Related U.S. Application Data

[62] Division of application No. 08/831,280, Mar. 31, 1997, Pat. No. 5,852,635, which is a division of application No. 08/602,479, Feb. 20, 1996, Pat. No. 5,677,651, which is a division of application No. 08/187,267, Jan. 25, 1994, Pat. No. 5,614,905.

[51] Int. Cl.$^6$ .............................. H04B 3/00; H04L 25/00

[52] U.S. Cl. .......................... 375/257; 370/445; 370/447

[58] Field of Search .................................. 375/257, 259; 370/445, 447, 449, 451, 461

[56] References Cited

U.S. PATENT DOCUMENTS

| | | | |
|---|---|---|---|
| 5,544,323 | 8/1996 | Heaton et al. | 395/200.14 |
| 5,598,406 | 1/1997 | Albrecht et al. | 370/296 |

*Primary Examiner*—Stephen Chin
*Assistant Examiner*—Mohammad Ghayour
*Attorney, Agent, or Firm*—Townsend and Townsend and Crew; Kenneth R. Allen

[57] ABSTRACT

An Ethernet-type local area network having multiport repeaters and nodes within a specified distance of the hub is able to communicate high speed digital data over multiple pairs of twisted-pair wires using long symbol group-type ternary coding. Bundle mode termination minimize impedance mismatches. Low-frequency collision detection circuitry permits detection of packet collisions on an a.c.-coupled network. Precise serialized digital to analog conversion is realized using chains of gates to form delay elements with precise delays.

1 Claim, 10 Drawing Sheets

| | | | | | | | |
|---|---|---|---|---|---|---|---|
| 0 | 222000 | 1 | 221100 | 2 | 212100 | 3 | 122100 |
| 4 | 220200 | 5 | 211200 | 6 | 121200 | 7 | 202200 |
| 8 | 112200 | 9 | 022200 | 10 | 221010 | 11 | 212010 |
| 12 | 122010 | 13 | 220110 | 14 | 211110 | 15 | 121110 |
| 16 | 202110 | 17 | 112110 | 18 | 022110 | 19 | 210210 |
| 20 | 120210 | 21 | 201210 | 22 | 111210 | 23 | 021210 |
| 24 | 102210 | 25 | 012210 | 26 | 220020 | 27 | 211020 |
| 28 | 121020 | 29 | 202020 | 30 | 112020 | 31 | 022020 |
| 32 | 210120 | 33 | 120120 | 34 | 201120 | 35 | 111120 |
| 36 | 021120 | 37 | 102120 | 38 | 012120 | 39 | 200220 |
| 40 | 110220 | 41 | 020220 | 42 | 101220 | 43 | 011220 |
| 44 | 002220 | 45 | 221001 | 46 | 212001 | 47 | 122001 |
| 48 | 220101 | 49 | 211101 | 50 | 121101 | 51 | 202101 |
| 52 | 112101 | 53 | 022101 | 54 | 210201 | 55 | 120201 |
| 56 | 201201 | 57 | 111201 | 58 | 021201 | 59 | 102201 |
| 60 | 012201 | 61 | 220011 | 62 | 211011 | 63 | 121011 |
| 64 | 202011 | 65 | 112011 | 66 | 022011 | 67 | 210111 |
| 68 | 120111 | 69 | 201111 | 70 | 021111 | 71 | 102111 |
| 72 | 012111 | 73 | 200211 | 74 | 110211 | 75 | 020211 |
| 76 | 101211 | 77 | 011211 | 78 | 002211 | 79 | 210021 |
| 80 | 120021 | 81 | 201021 | 82 | 111021 | 83 | 021021 |
| 84 | 102021 | 85 | 012021 | 86 | 200121 | 87 | 110121 |
| 88 | 020121 | 89 | 101121 | 90 | 011121 | 91 | 002121 |
| 92 | 100221 | 93 | 010221 | 94 | 001221 | 95 | 220002 |
| 96 | 211002 | 97 | 121002 | 98 | 202002 | 99 | 112002 |
| 100 | 022002 | 101 | 210102 | 102 | 121102 | 103 | 201102 |
| 104 | 111102 | 105 | 021102 | 106 | 102102 | 107 | 012102 |
| 108 | 200202 | 109 | 110202 | 110 | 020202 | 111 | 101202 |
| 112 | 011202 | 113 | 002202 | 114 | 210012 | 115 | 120012 |
| 116 | 201012 | 117 | 111012 | 118 | 021012 | 119 | 102012 |
| 120 | 012012 | 121 | 200112 | 122 | 110112 | 123 | 020112 |
| 124 | 101112 | 125 | 011112 | 126 | 002112 | 127 | 100212 |
| 128 | 010212 | 129 | 001212 | 130 | 200022 | 131 | 110022 |
| 132 | 020022 | 133 | 101022 | 134 | 011022 | 135 | 002022 |
| 136 | 100122 | 137 | 010122 | 138 | 001122 | 139 | 000222 |

*FIG. 5A*

| | | | | | | | |
|---|---|---|---|---|---|---|---|
| 140 | 222100 | 141 | 221200 | 142 | 212200 | 143 | 122200 |
| 144 | 222010 | 145 | 221110 | 146 | 212110 | 147 | 122110 |
| 148 | 220210 | 149 | 211210 | 150 | 121210 | 151 | 202210 |
| 152 | 112210 | 153 | 022210 | 154 | 221020 | 155 | 212020 |
| 156 | 122020 | 157 | 220120 | 158 | 211120 | 159 | 121120 |
| 160 | 202120 | 161 | 112120 | 162 | 022120 | 163 | 210220 |
| 164 | 120220 | 165 | 201220 | 166 | 111220 | 167 | 021220 |
| 168 | 102220 | 169 | 012220 | 170 | 222001 | 171 | 221101 |
| 172 | 211101 | 173 | 122101 | 174 | 220201 | 174 | 211201 |
| 176 | 121201 | 177 | 202201 | 178 | 112201 | 179 | 022201 |
| 180 | 221011 | 181 | 212011 | 182 | 122011 | 183 | 220111 |
| 184 | 211111 | 185 | 121111 | 186 | 202111 | 187 | 112111 |
| 188 | 022111 | 189 | 210211 | 190 | 120211 | 191 | 201211 |
| 192 | 111211 | 193 | 021211 | 194 | 102211 | 195 | 012211 |
| 196 | 220021 | 197 | 211021 | 198 | 121021 | 199 | 202021 |
| 200 | 112021 | 201 | 022021 | 202 | 210121 | 203 | 120121 |
| 204 | 201121 | 205 | 111121 | 206 | 021121 | 207 | 102121 |
| 208 | 012121 | 209 | 200221 | 210 | 110221 | 211 | 020221 |
| 212 | 101221 | 213 | 011221 | 214 | 002221 | 215 | 221002 |
| 216 | 212002 | 217 | 122002 | 218 | 220102 | 219 | 211102 |
| 220 | 121102 | 221 | 202102 | 222 | 112102 | 223 | 022102 |
| 224 | 210202 | 225 | 120202 | 226 | 201202 | 227 | 111202 |
| 228 | 021202 | 229 | 102202 | 230 | 012202 | 231 | 220012 |
| 232 | 211012 | 233 | 121012 | 234 | 202012 | 235 | 112012 |
| 236 | 022012 | 237 | 210112 | 238 | 120112 | 239 | 201112 |
| 240 | 011112 | 241 | 021112 | 242 | 102112 | 243 | 012112 |
| 244 | 201212 | 245 | 110212 | 246 | 020212 | 247 | 101212 |
| 248 | 011212 | 249 | 002212 | 250 | 210222 | 251 | 120022 |
| 252 | 201022 | 253 | 111022 | 254 | 021022 | 255 | 102022 |

*FIG. 5B*

NETWORK SYSTEM USING LOW-SPEED PREAMBLE FOR LINKING USER NODES USING HIGH SPEED CSMA/CD COMMUNICATION

This is a division of and claims the benefit of U.S. application Ser. No. 08/831,280 filed Mar. 31, 1997; now U.S. Pat. No. 5,852,635; which is a division of Ser. No. 08/602,479 filed Feb. 20, 1996, now U.S. Pat. No. 5,677,651; which is a division of Ser. No. 08/187,267 filed Jan. 25, 1994 now U.S. Pat. No. 5,614,905.

BACKGROUND OF THE INVENTION

This invention relates to local area network (LAN) communication and specifically, to CSMA/CD communication of the type commonly used in accordance with a network standard known as Ethernet. Ethernet contemplates packet communication via a shared medium in which all stations or nodes can monitor all broadcast messages on a network. An Ethernet local area network standard has been adopted under designation IEEE 802.3. An adaptation of the standard to telephone-type wiring is the IEEE 802.3 10BaseT standard in which the medium is unshielded twisted pair wire.

There is a trade-off between the maximum network diameter, or the electrical distance between the two furthest-apart network nodes within a contiguous network sharing the same medium, and the minimum size of a message unit or packet carried on the medium of a local area net using the IEEE 802.3 standards. The 802.3 standard specifies a 10 Megabit/second (MBPS) data rate and a 51.2 microsecond ($\mu$s) minimum packet length. The round-trip time across the diameter of a network must be less than the time for transmission of a packet of the minimum packet length to ensure that a station is always able to detect if a packet has collided with a packet from another node or station. Under current standards of 10 MBPS, a diameter of 2500 meters allows transmission of 512 bits in a 51.2 microsecond packet length. The maximum packet rate is therefore 14,881 packets per second. By contrast, if either the network diameter is reduced by a factor of 10 and all other performance parameters are raised by a factor of 10, for example, the unavoidable requirement that the minimum-sized packets and the round-trip time through the maximum network diameter has resulted in unacceptable combinations of minimum packet size and network diameter.

The 10BaseT adaptation of the 802.3 standard allows the physical structure to be star-wired with each station or node being connected at the tip of a star through spokes formed by a loop which is connected to a center or hub. Interconnection of the stations is at the hub such that all stations tied to a hub have the same logical connectivity as stations connected to a bus-type system. However, each link of the spoke must have a port at the hub which contains active electronics, and the hub typically must be supplied with electrical power. The hub box represents a potential common point of failure. However, since each station is connected to a separate port on the box, there is an opportunity for individual monitoring of the status of each station connection at the hub from a central location, which is a very important consideration in network management.

Hubs are also useful in that bridges can be used to isolate hub bandwidth traffic which is local to a single hub. Therefore, hubs are being used increasingly to allow physical management of the wires to a hub as well as easy logical management of the ports on the hub. Therefore, it become practical to consider network diameters considerably smaller than those specified in the Ethernet standard.

One of the areas of emerging agreement for a new standard for digital networks is the adoption of the standard media access control (MAC) protocol defined by Ethernet. On the other hand, if there is a single point to point link, full duplex communication is possible, and there is no need for a MAC.

Terminators are known for multiple-path solid media. It is believed that LAN manufacturer Synoptics has a design for such a terminator. A simple and low-cost terminator may allow the implementation of practical highspeed networks using relatively low-grade wire media.

SUMMARY OF THE INVENTION

According to the invention, a CSMA/CD multiport local area network is provided with a star physical design which employs a multiport hub operating at a data rate of approximately an order of magnitude greater than permitted under conventional standards for twisted pair wiring and which communicates with nodes spaced apart on spokes of a star connection to the hub, each spoke having an electrical length within less than about $\frac{1}{10}$ of the conventionally-allowable network diameter of a conventional twisted pair network. In other words, the electrical distance for a round-trip path between any node and the hub has a data rate-round-trip transit time product of less than the standardized packet duration. In a specific embodiment, the data rate is 100 MBPS and the spoke length is less than 100 meters. A standardized packet duration is 51.4 microseconds. The round-trip transit time over a round-trip path length is less than 40 microseconds. In addition, a two-port bridge may provided for connection of devices more than 100 meters from the hub or which operate at data rates other than the nominal hub data rate (100 MBPS). In an alternative embodinent, multiport bridges are provided in a hub box, each bridge servicing a single node per port. Full duplex links and network controllers are provided at each end of a spoke so that collision detection is not necessary, as collisions would never occur. A full duplex link would permit bidirectional traffic with a throughput which is double that for a given physical link speed, i.e., 200 MBPS between multiport bridges. It would further follow that there would be a lower probability of error per packet sent. Only the links between the two nodes and the hub need be operational and error free. Status or functionality of other links have no effect. A preferred coding scheme is a group code which is reasonably efficient and can be d.c. balanced. Such a code which capable of unique identification of a large number of groups symbols is the 8 Binary to 6 Ternary (8B6T) group code. In an 8B6T code, 8 binary bits are mapped into a group of six three-level or ternary symbols. Media choices include various configurations of twisted pair wiring, including multiple pairs of unshielded twisted pairs. An important consideration is the form of termination. A bundle mode terminator provides a substantial match of the characteristic impedance.

The invention will be better understood by reference to the following detailed description in connection with the accompanying drawings.

BRIEF DESCRIPTION OF THE DRAWINGS

FIGS. 5A–5B are a table of the implementation of one 8B6T group code.

DESCRIPTION OF SPECIFIC EMBODIMENTS

Figure 1:
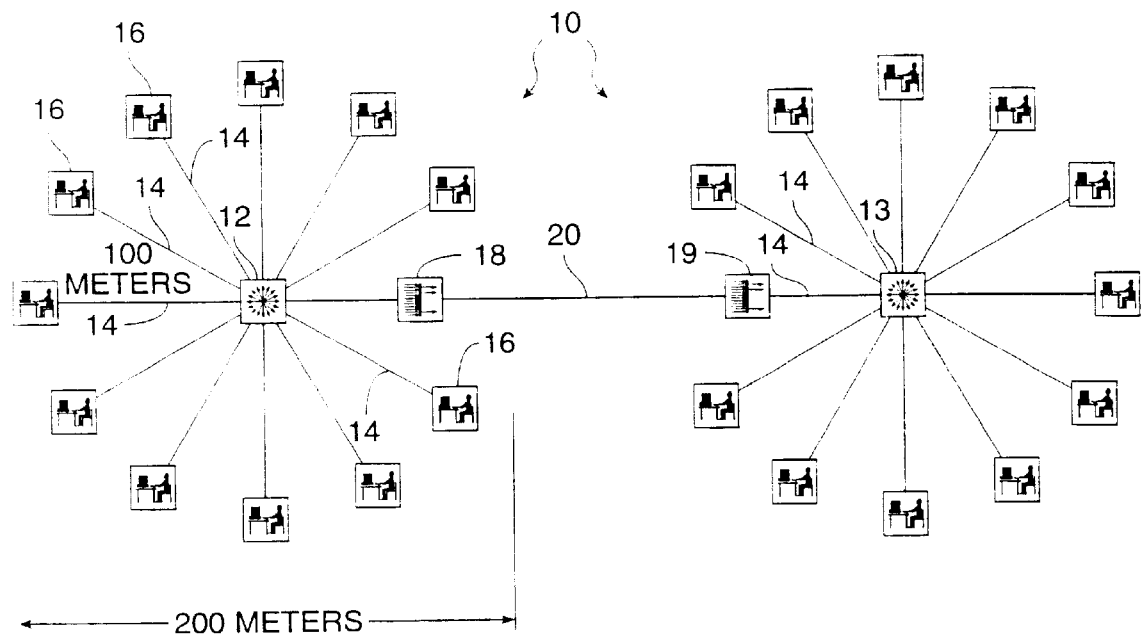
FIG. 1 is a block diagram of a local area network using a high-speed star configuration with a repeating hub, spokes, nodes and multiport bridges in accordance with the invention.

FIG. 1 is a block diagram of an Ethernet-type local area network 10 using a high-speed star configuration with repeating hubs 12, 13, spokes 14, nodes 16 and multiport bridges 18, 19 connected by a link 20 in accordance with the invention. This type of system has the ability to support a point-to-point link, but it also is capable of supporting collision detection protocols, such as CSMA/CD.

With each repeating hub is associated a Media Access Control (MAC) layer. While this configuration has been used with low-speed coaxial and twisted pair LANs in the past, the constraints have been different. The constraints herein are based on a scaled Media Access Control (MAC) layer, the scaling of the transmission speed and dimensions of the network being to support data throughput at up to 100 MBPS. If the speed is scaled up by ten times, this electrical diameter (round-trip delay) must be scaled down to one-tenth to accommodate the duration a packet as measured in bit times. Herein the operational diameter is constrained to be under 250 meters, and preferably about 200 meters, the exact limit being subject to the propagation delay budgets or the individual components. The maximum network diameter is determined by the sum of the cable lengths in electrical distance between the two nodes furthest apart, which is measured by the round-trip propagation delay from a source node 16 to a destination node 16' through the spokes 14 and the repeating hub 12.

Whereas networks with bridges have been employed in the past to isolated network traffic, herein bridges 18, 19 are employed primarily to control the size or diameter of the collision domain. The MAC layer does not propagate through the bridges 18 or 19, since the bridges 18, 19 occupy a higher layer in the communication protocol. Packets are propagated through the bridge 18 to the bridge 19 on link 20, which may or may not employ an associated MAC layer. The MAC layers associated with each hub 12, 14 are isolated from one another.

An important consideration in any configuration is the use of a signalling scheme to fit the widest breadth of cable types used in the horizontal run. Shielded Twisted Pair or STP (IBM Type 1) wiring is a candidate. Another candidate is two, three or four pair bundles of Category 3, 4 or 5 unshielded twisted pair wiring (UTP). Multiple pairs allow for maximizing the throughput of information without exceeding the bandwidth constraints of the media.

The signalling scheme is also important. A preferred signalling scheme is 8B6T or "8 binary to 6 ternary" encoding wherein groups of eight binary bits are mapped to a group of six three-level codes, represented by +1, 0, and -1 levels. The code groups of six-level codes range from: -1-1-1-1-1-1 (having a d.c. net amplitude of -6) to: 1+1+1+1+1+1 (having a net d.c. amplitude of +6). The mapping is not one-for-one. Symbol groups are preferably chosen with several constraints in mind. The primary constraint is to select, from the available symbol groups, those symbol groups which are either d.c. balanced or whose d.c. balance is either plus 1 or minus 1 (+1 or -1).

In a twisted pair medium, differential signalling is preferably employed to communicate information packets. Collision detection is achieved in a broadband medium by using a detector at the transmitter and looking for any other signal on the medium after subtracting the transmitter's own signal from the medium. In the signalling protocol, the preamble of each packet contains a low frequency component to guarantee the ability to detect the presence of a carrier at the far end of the medium. According to the preferred embodiment, whenever a transceiver detects a collision, the transmission in progress at that transceiver is mapped to low frequency. This mapping ensures continued carrier detection and thus recognition of the "end of collision" condition at any repeater.

Figure 2:
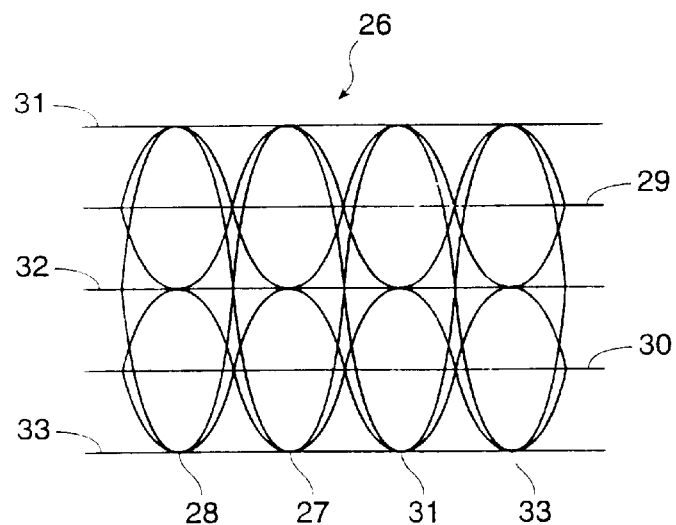
FIG. 2 is a timing diagram or eye pattern of a three-level code.

FIG. 2 is a timing diagram or eye pattern 26 of a three-level code in accordance with the invention. This is the pattern which would be observed on an oscilloscope operating on a fixed periodic trigger synchronized to the data clock observing the application of a random sequence of single-valued functions of time (such as a three-level six unit-group as output from encoder 34 of FIG. 3). Symbols are sampled at baud times 27, 28, 29, 31, 33. Transition times between baud times are not defined. Distirction between values is judged relative to two thresholds, a high threshold 29 and a low threshold 30 between a high level 31, a zero or d.c. neutral level 32 and a low level 33. The signal-to-noise ratio is the restraint on reliable detection. An analysis of the contemplated noise environment for voice grade unshielded twisted pair (Category III UTP) wiring carrying a signal suggests that 100 MBPS is feasible but that the noise would require that more than two pairs of UTP wiring be used wherein each pair carries part of a code group at an appropriately low baud (symbol) rate.

Figure 3:
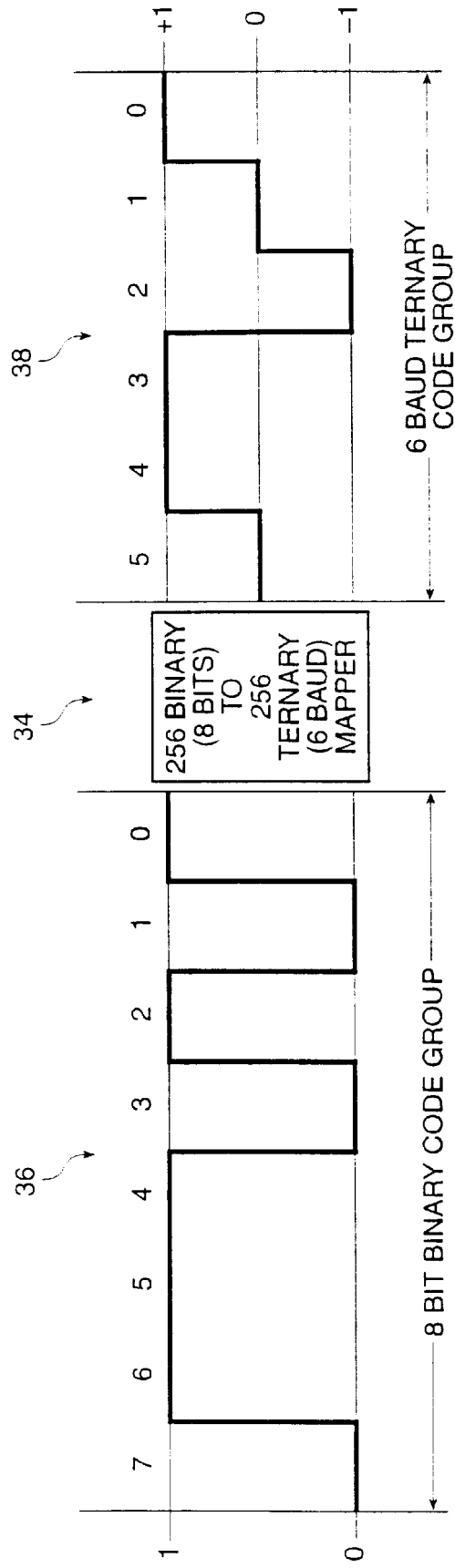
FIG. 3 is a symbolic diagram of an 8B6T encoder in accordance with the invention.

FIG. 3 is a symbolic diagram of an 8B6T encoder 34. Eight-bit long binary code groups (0–7) 36 are provided to the encoder 30, which produces therefrom in real time (and at ¾ speed) groups 38 of six three-level codes. The three-level code 38 is used to modulate media through a transmitter in order to produce the three-level pattern which is the eye pattern. The encoder 34 may be a look-up table which translates groups of eight binary bits to two groups of 6 binary bits (12 bits), each dual corresponding to a single ternary (three-level) code. Alternatively, an array of random logic could be designed which produces the encoding. The exact form is beyond the scope of this disclosure.

Figure 4:
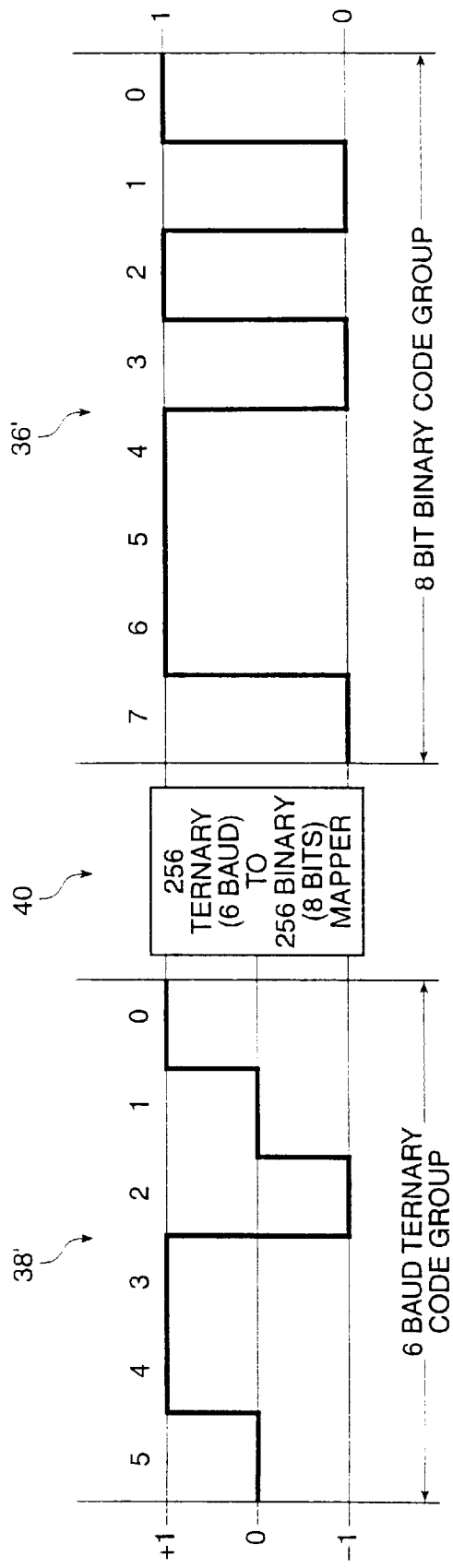
FIG. 4 is a symbolic diagram of an 8B6T decoder in accordance with the invention.

FIG. 4 is a symbolic diagram of an 8B6T decoder 40 in accordance with the invention. Ternary data 38' in code groups of six symbols extracted from a channel (filtered and shaped) is applied to the decoder 40 which in turn converts it to the corresponding group of eight binary codes 36'. The decoder 40 may also be a look-up table or an array of random logic. Decoding is by means of a two-threshold detection scheme with a recovered clock at a known frequency assuming a baseband signal without a d.c. component (such that the nodes can be a.c. coupled to the network medium).

FIG. 5 is a table of the implementation of one 8B6T group code. This table is provided by way of illustration and is believed to represent a near canonical realization of the mapping. Other mappings between the two groups are possible, so this is shown merely for illustrative purposes.

An analysis of the distribution of D.C. balances of all possible symbol groups of a ternary code reveals that there are 141 symbol groups in a six-symbol group-based ternary code having a d.c. balance of 0; 126 symbol groups having a d.c. balance of +1; and 126 symbol groups having a d.c. balance of −1. Of the 393, only 266 symbol groups have a d.c. balance of zero or a d.c. balance of +1 or −1. The symbol group with no transitions (000000) and the nine symbol groups with maximum peak spectrum may be discarded, leaving exactly 256 symbol groups to correspond to the 8 binary symbol groups.

There is of course a large number of possible mappings of 256 binary code groups to the preferred set of 256 ternary code groups. The choice may depend further on the expected frequency of occurrence of particular symbol groups. In general, frequently-used codes would probably be assigned the symbol group producing the minimum peak spectrum to minimize bandwidth usage. The exact mapping is beyond the scope of this disclosure.

Figure 6:
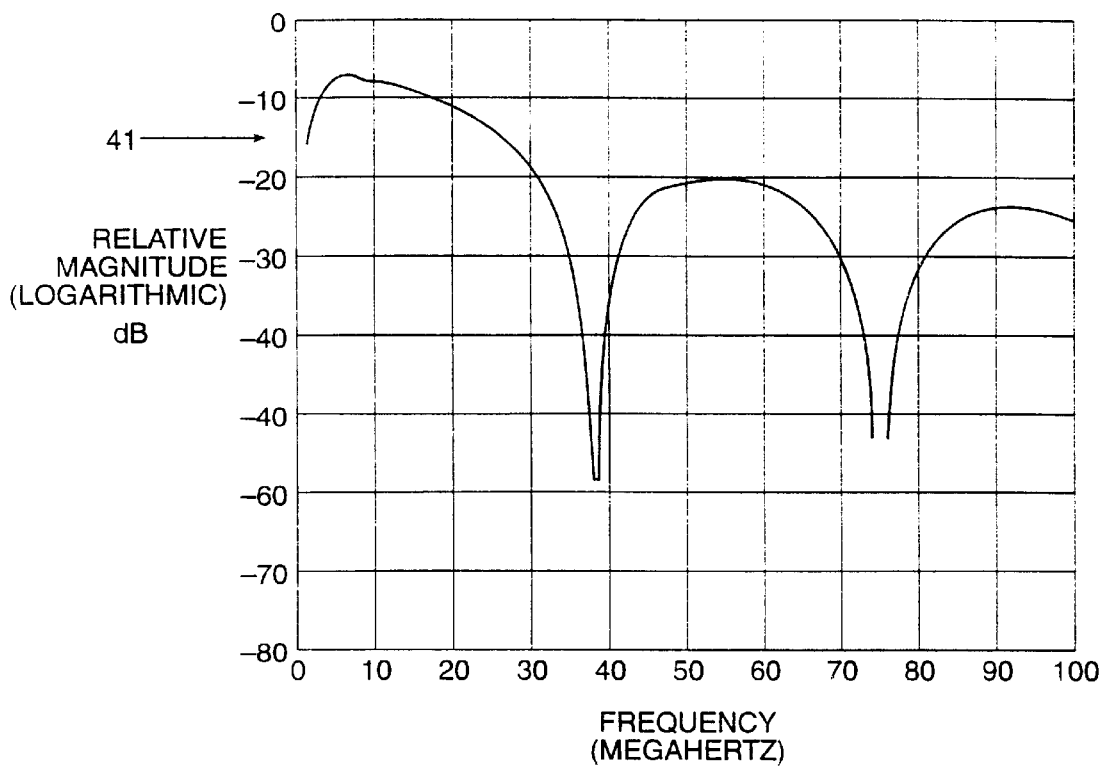
FIG. 6 is a spectrum diagram of an 8B6T signal.

FIG. 6 is a spectrum diagram of an 8B6T signal 41 operative over two pairs of wires at a rate of 37.5 Mbaud/pair. A spectral peak is at between 7 and 15 MHz and a null is at the baud rate of 37.5 MHz. Secondary peaks are between 45 MHz and 65 MHz. The relative low-level signal near 30 MHz is consistent with FCC emission suppression requirements.)

Figure 7:
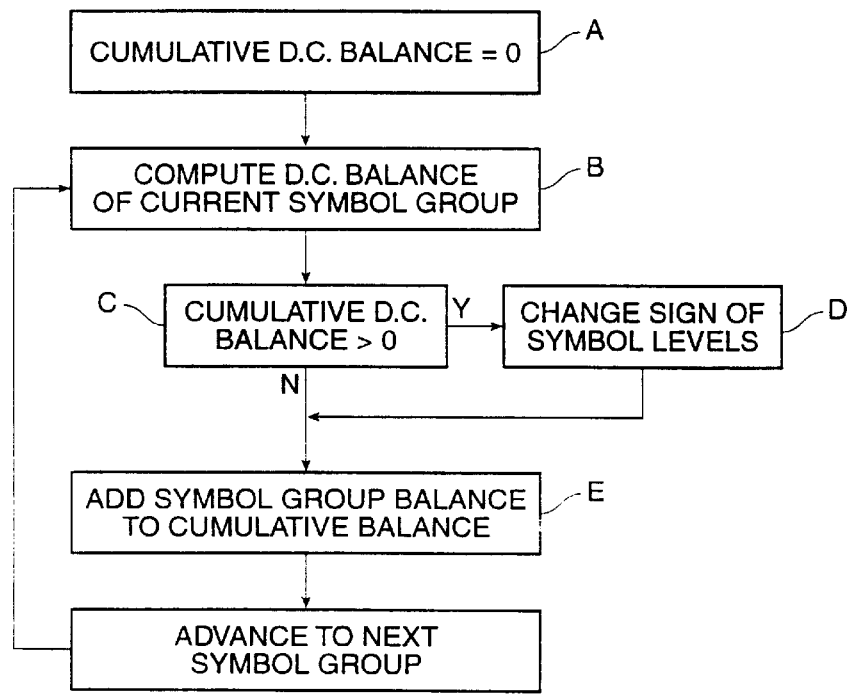
FIG. 7 is a flow chart illustrating a technique for recovery of D.C. offset of a symbol group.

D.C. offset recovery is important in any quasi-d.c. balanced code. One technique used in a decoder so that d.c. balance can be assumed in the decoding process is shown in FIG. 7. At a point in the transmission, the cumulative D.C. balance is zero, meaning that there is as much energy above a neutral threshold as below (Step A). A processor may compute the D.C. balance for a current symbol group (Step B), then judge whether the cumulative D.C. offset from all sources is greater than zero (Step C). If yes, then the modulator or processor inverts the sign of the symbol level (Step D) and in any case sums the current symbol group balance (including sign) to a cumulative balance (Step E) so that the cumulative balance, if greater than zero, is subtracted from the current D.C. balance (Step E). The process then advances to the next symbol (Step F) and repeats the computation of the D.C. balance for the current symbol group (Step B). The D.C. level is the summation of Step E. The process continues until the entire data stream has been processed.

Unshielded twisted pair (UTP) wiring is a wiring scheme of preference for networking applications where the cable can be characterized and spurious interference can be controlled. One mechanism for control is cable termination. A preferred termination is a "bundle mode" anechoic termination block. Examples of two types of bundle mode termination blocks for a four-pair unshielded twisted pair are shown schematically in FIGS. 8 and 9.

Figure 8A:
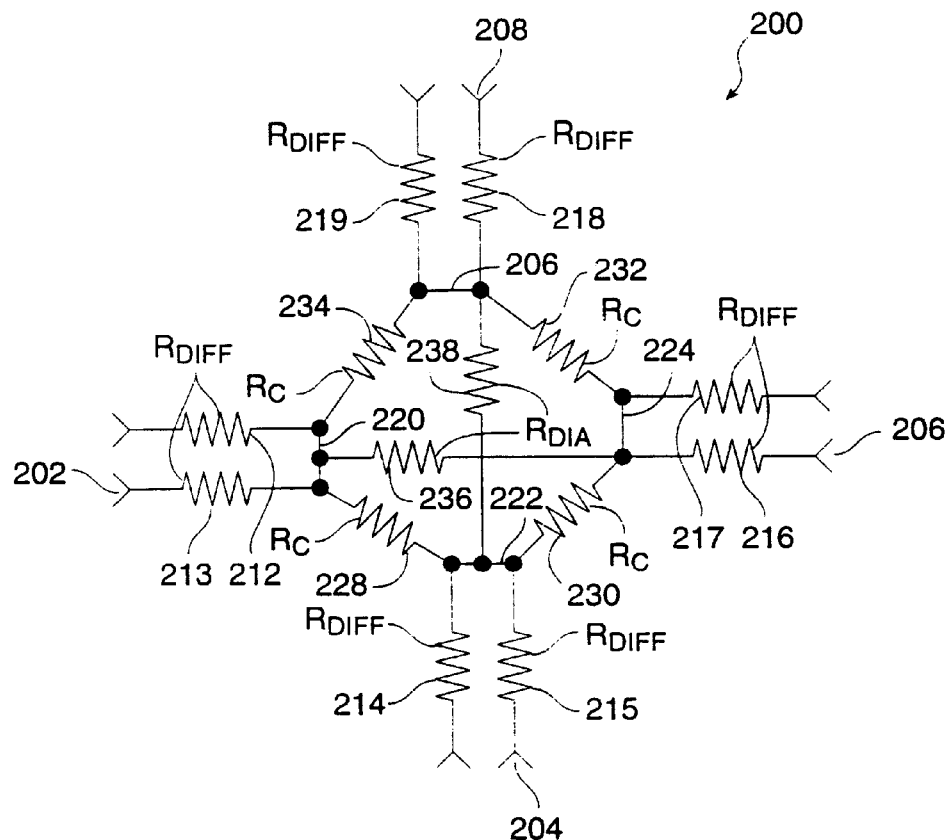
FIGS. 8A and 8B are schematic diagrams of an asymmetrical bundle mode termination of a four-pair UTP bundle.
Figure 8B:
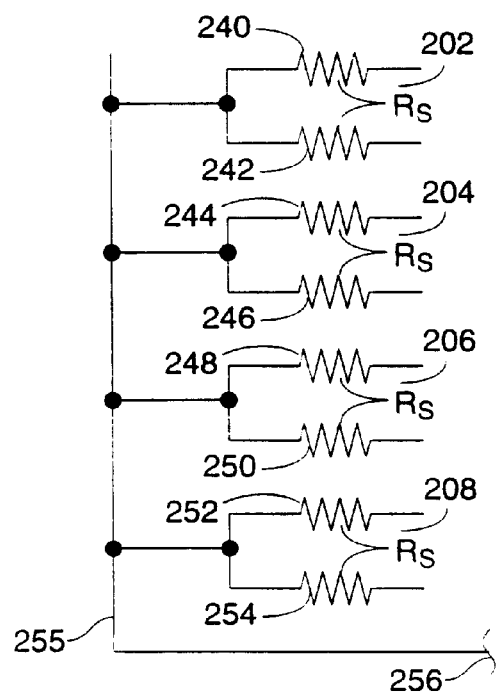

In FIGS. 8A and 8B, there are shown an asymmetrical termination 200 for four pair of twisted pairs 202, 204, 206, 208, which may optionally he shielded. According to the invention, the asymmetrical bundle mode termination is provided by a plurality of pairs (202, 204, 206, 208 are respectively coupled through series resistances 212, 213; 214, 215; 216, 217; 218, 219, each of which has a value equal to a difference term $R_{DIFF}$, each pair of which is terminated in one common mode node 220, 222, 224, 226, and further including common mode resistances 228, 230, 232, 234 coupled between the respective common mode nodes 220, 222, 224, 226 and each having a value equal to common mode resistance term $R_C$, and further including first and second adiagonal termination resistances 236, 238 having a value equal to a diagonal resistance term $R_{DIA}$, the diagonal termination resistances 236, 238 being coupled between non-adjacent common mode nodes and across at least two common mode resistances.

For a shielded twisted pair, that is, in an environment where all pairs 202, 204, 206, 208 are shrouded within a conductive shield 256, each individual line in the twisted pair bundle 200 is preferably coupled through a shield resistance 240, 242, 244, 246, 248, 250, 252, 254 to a common node 255 which is directly coupled to the enshrouding shield 256, the shield resistances each having a value equal to a shield resistance term $R_S$. All of the elements of the bundle mode termination 200 may be incorporated in a terminator element or device with pin, block or like connectors for the wires. The impedance-matching termination between the branches and the environment is a particular advantage because it assures that the terminations for all drops of the media terminate in a uniform impedance chosen to match the characteristic impedance of the bundle 200.

Figure 9:
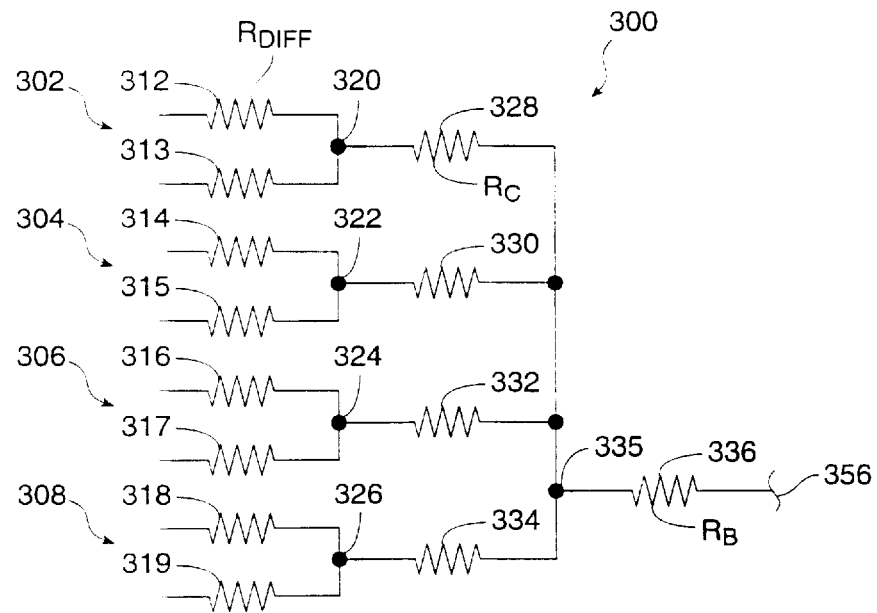
FIG. 9 is a schematic diagram of a symmetrical bundle mode resistive termination of a four-pair UTP bundle.

FIG. 9 illustrates an approximate model for a bundle mode termination, herein termed a symmetrical termination 300. Each pair 302, 304, 306, 308 is terminated as a pair and is respectively coupled through series resistances 312, 313; 314, 315; 316, 317; 318, 319, each of which has a value equal to a difference term $R_{DIFF}$, each pair of which is terminated in one common mode node 320, 322, 324, 326, and further including common mode resistances 328, 330, 332, 334 each coupled between one common mode node and a single bundle mode node 335. The single bundle mode node is coupled through a single bundle mode resistance 336 having a value equal to a bundle mode term $R_B$ to a Conductive shield 356 enshrouding the bundle 300. The bundle mode termination appears like a continuation of the twisted pair media for all voltage modes in the cable, thus minimizing the deleterious effects of signal reflections associated with an unmatched termination.

Figure 10:
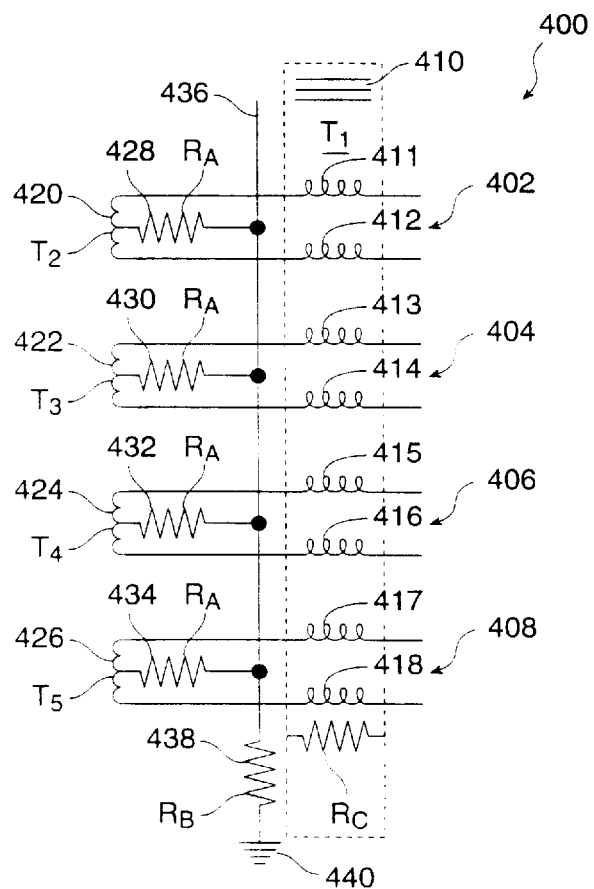
FIG. 10 is a schematic diagram of a symmetrical bundle mode inductive/resistive termination.
Figure 11:
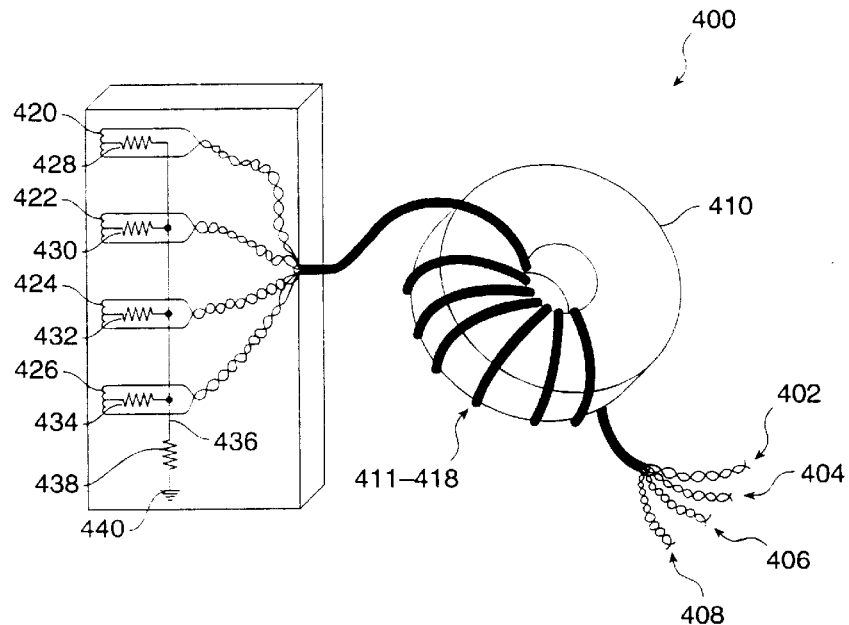
FIG. 11 is a depiction of a physical representation of a symmetrical bundle mode inductive/resistive termination.

A still more accurate bundle mode termination device is illustrated schematically in FIG. 10 and depicted as a physical device in FIG. 11. An inductor-based termination 400 for four pairs 402, 404, 406, 408 are each coupled through inductors 411, 412; 413, 414; 415, 416; 417, 418, wound on a common toroidal core T1 410, typically a ferrite toroid. The core has a characteristic core impedance $R_C$ which impacts impedance of the termination as explained hereinafter. The pairs 402, 404, 406, 408 are each terminated in center tapped transformers T2 420, T3 422, T4 424 and T5 426, respectively. Center taps are each terminated respectively in first termination resistors $R_A$ 428, 430, 432, 4341, each of which has a resistance value of $R_A$, as hereinafter explained. The first termination resistors are coupled to a common node 436 of a second termination resistor $R_B$ 438 having a resistance value $R_B$ and coupled to a chassis ground 440.

An analysis of the schematic of FIG. 10 yields the following: The pair-to-pair common mode impedance is given by the value $2R_A$. The bundle mode termination impedance is given by the formula:

$$Z_{BM}=R_A/4+R_B+R_C$$

where $R_C$ is the parallel resistance of common mode transformer $T_1$.

The foregoing formulas can be used to select the values of the resistance used in the terminating device or to determine the impedance of the bundle mode termination given the resistance values.

In a binary or ternary signal level system which is implemented digitally, it is necessary to convert digital data into an analog signal. Where the digital data is serialized, an analog signal can be obtained by tapping a chain of shift registers. Ternary logic can be represented by two binary digits, so parallel binary-level lines may be employed to produce a single ternary analog signal output through taps to a common analog signal line.

Figure 12:
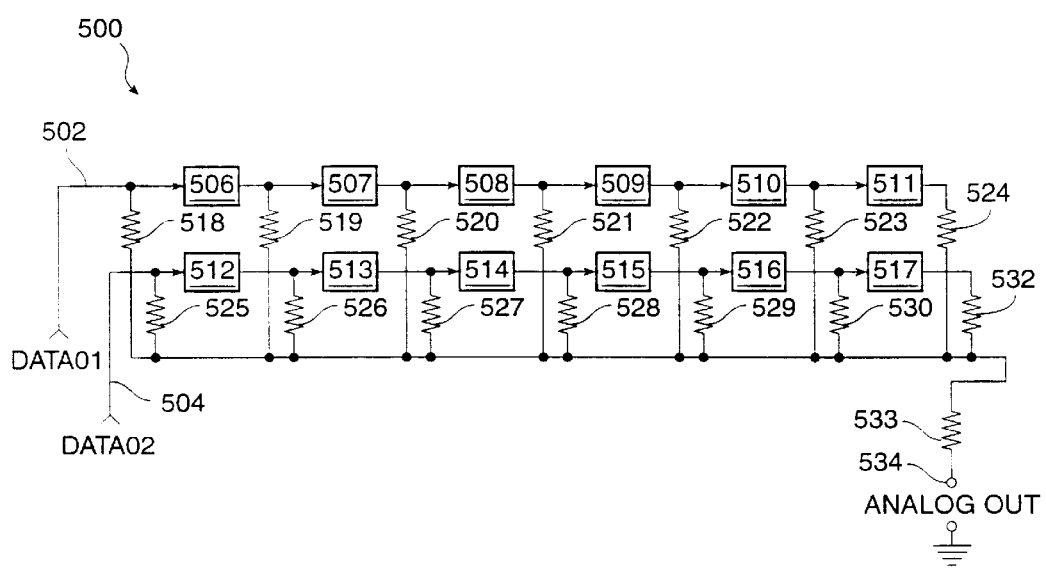
FIG. 12 is a schematic block diagram of a dual serial digital data to analog signal converter with delay elements according to the invention.

A suitable serial data digital to analog converter (DAC) is a digital shift register with signal taps to a summing node from which an analog signal can be extracted. However, as shown in FIG. 12, according to the invention, a preferred serial digital to analog converter for a three level code having high precision without the use of a shift register can be realized with binary data channels. The serial digital to three-level analog converter comprises a dual binary input DAC 500 having pair of data input channels 502, 504 each coupled to feed a series of delay line elements 506–511, 512–517, with resistor-buffered taps 518–524, 525–531 between each delay element to a common signal node 532 feeding an output pad in the form of a resistor 533 in series with an analog output 534. Each of the delay line elements 506 is preferably a single one or a chain of NAND gates on silicon. The design can be generalized to N-level code with N−1 binary channels using the same topology.

Figure 13:
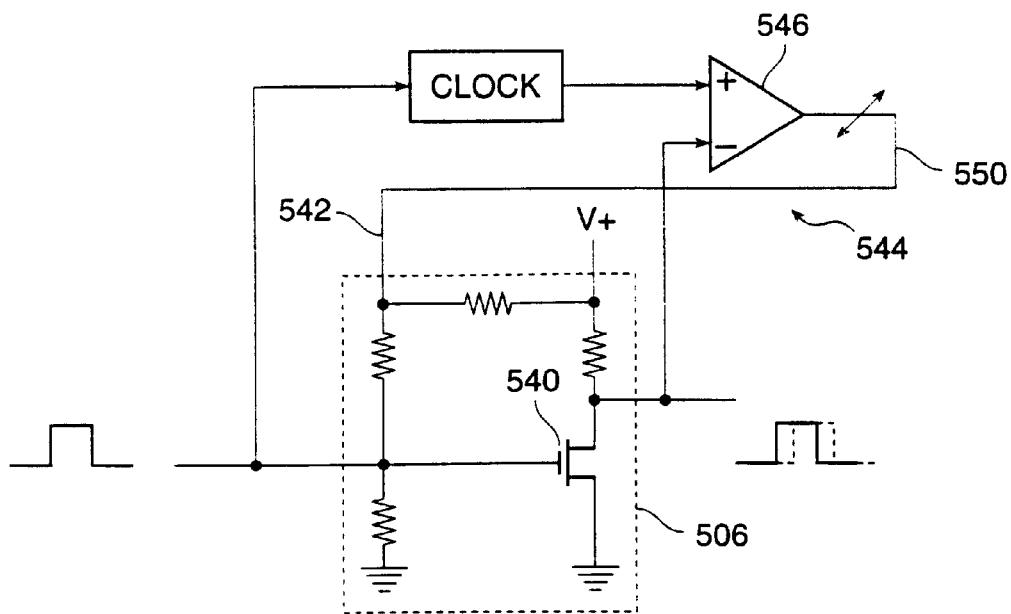
FIG. 13 is a schematic block diagram of a gate-based delay element according to a specific embodiment of the invention.

Referring to FIG. 13, each NAND gate 506 may have for example an input Field Effect Transistor (FET) 540 whose input gate terminal can be biased (bias control terminal 542) to control the delay. Further, each chain of NAND gates may be connected in a feedback loop 544 through a comparator 546 which compares the delay of propagation through the gate 506 with the cycle of a time reference (clock 548) to produce an error signal 550 which controls the bias level (at terminal 542). The realization is a chain of tapped delay elements 506–511 (formed of gates) with very precise propagation delays and very short delays (1–2 ns). Thus, much higher resolution can be achieved without modifying a system clock, and output filtering is much easier. In fact, a fixed implementation of a finite impulse response filter can be realized using this technique.

Figure 14:
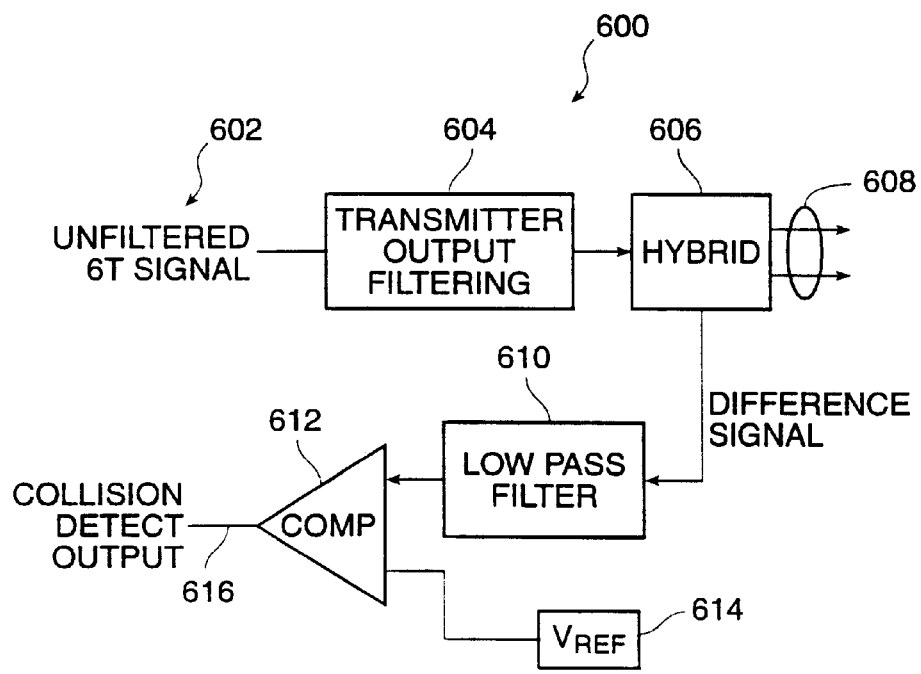
FIG. 14 is a schematic diagram of a low frequency detector according to the invention.

FIG. 14 illustrates a low-frequency collision detection transceiver circuit 600 according to the invention. Low-frequency collision detection is useful in an a.c. coupled network or a channel whose low-frequency attenuation is much less than its high-frequency attenuation, which allows for a better signal-to-noise ratio at low frequency and enables the detector to recover energy from the medium more easily. According to the invention, on the transmission side, an unfiltered 6T signal having a low-frequency preamble of for example a sequence 602 of two or three maximum-deviation three-level transitions in groups of six, is applied at a rate of less than one-half the baud rate with each packet to a transmitter/output filter 604, which in turn applies the signal to a hybrid/line matching circuit 606. The circuit 606 matches with the characteristic impedance of a twisted pair line 608 (one of two or three), applying the signal to the network. The hybrid 606 monitors the line 608 for its own output signals and separates its own output signals from received signals by conventional subtraction, directing only the difference signals to a receive side via a lowpass filter 610.

The lowpass filter 610 cuts off all high-frequency components of the input signal, allowing the low-frequency components of the preamble to pass to a comparator 612. The comparator 612 compares the low-frequency components with a threshold voltage reference $V_{REF}$ 614. The comparator 612 senses the presence of low-frequency energy above the reference voltage and issues a "TRUE" output (the collision detect output 616) as an indication that the medium is occupied. No d.c. component is needed, although this circuit could detect d.c. if there is no transformer coupling. However, this circuit specifically avoids the need for d.c. coupling.

The invention has now been explained with respect to specific embodiments. Other embodiments will be apparent to those of ordinary skill in the art upon reference to this explanation. It is therefore not intended that invention be limited except as indicated by the appended claims.

What is claimed is:

1. In a local area network communicating carrier sense multiple access/collision detection (CSMA/CD) data over a medium having a plurality of nodes interconnected via alternating current (a.c.) coupling to a communication medium, the improvement comprising:

a low-frequency preamble generator a.c. coupled to the communication medium at each of the nodes for applying a low-frequency preamble at the beginning of each packet to signal occupancy by said packet of said communication medium, said a.c. coupling being of a type such that the low frequency preamble is of sufficient amplitude that subtraction based detection can be used; and a low-frequency preamble detector a.c. coupled to the communication medium at each of the nodes for detecting the low-frequency preamble indicative of potential collision of packets transmitted on said communication medium.

* * * * *